US008482082B2

(12) United States Patent
Lai

(10) Patent No.: US 8,482,082 B2
(45) Date of Patent: Jul. 9, 2013

(54) ELECTROSTATIC DISCHARGE PROTECTION DEVICE

(75) Inventor: Ming-Fang Lai, Chiayi County (TW)

(73) Assignee: Nuvoton Technology Corporation, Hsinchu (TW)

( * ) Notice: Subject to any disclaimer, the term of this patent is extended or adjusted under 35 U.S.C. 154(b) by 0 days.

(21) Appl. No.: 13/239,392

(22) Filed: Sep. 22, 2011

(65) Prior Publication Data

US 2013/0075829 A1    Mar. 28, 2013

(51) Int. Cl.
*H01L 29/66* (2006.01)

(52) U.S. Cl.
USPC ............................................... 257/378

(58) Field of Classification Search
USPC ................ 438/42, 421; 361/56, 57; 257/350, 257/E27.111, 173, 355; 327/313, 314, 320, 327/325, 327, 328
See application file for complete search history.

(56) References Cited

U.S. PATENT DOCUMENTS 6,025,746 A      2/2000  So
6,317,306 B1 *  11/2001  Chen et al. ................. 361/56
7,038,898 B1 *   5/2006  Pasqualini ................. 361/56

OTHER PUBLICATIONS

Barhordian, Vrej "Power MOSFET Basics," International Rectifier. Aug. 2010 http://tayloredge.com/reference/Electronics/Semiconductors/mosfetbasics.pdf.*
Neueuther, Andy, "The Devices," 1999. Berkley Notes. http://bwrc.eecs.berkeley.edu/Classes/icdesign/ee141_s00/Notes/chapter3.pdf.*

* cited by examiner

*Primary Examiner* — N Drew Richards
*Assistant Examiner* — Christina Sylvia
(74) *Attorney, Agent, or Firm* — CKC & Partners Co., Ltd.

(57) ABSTRACT

An electrostatic discharge (ESD) protection device includes a first transistor and a second transistor. The first transistor includes a first bulk electrode, a first electrode and a second electrode. The first bulk electrode and the first electrode form a first parasitic diode. The first bulk electrode and the second electrode form a second parasitic diode. The second transistor includes a second bulk electrode, a third electrode and a fourth electrode. The second bulk electrode and the third electrode form a third parasitic diode. The second bulk electrode and the fourth electrode form a fourth parasitic diode. The first bulk electrode is connected to the third electrode, and the second bulk electrode is connected to the first electrode.

16 Claims, 7 Drawing Sheets

ELECTROSTATIC DISCHARGE PROTECTION DEVICE

BACKGROUND

1. Technical Field

The present disclosure relates to a protection device. More particularly, the present disclosure relates to an electrostatic discharge protection device.

2. Description of Related Art

Conventionally, there is an electrostatic discharge (ESD) protection mechanism set in every kind of electronic apparatus, so as to prevent the electronic apparatus from being damaged due to a momentary large current when a human body carrying too many electrostatic charges touches the electronic apparatus, or to prevent the electronic apparatus from being affected by electrostatic charges existing in the environment or carried by transportation to abnormally operate.

For example, a single electronic device (e.g., integrated circuit chip) may have multiple power domains therein so as to provide the power required for different circuits to operate. However, employing multiple power domains in one single electronic device usually results in reduced ESD protection capability of the electronic device itself, such that the ESD protection mechanism cannot effectively protect the interface between different power domains, and further internal circuits can be thus damaged.

SUMMARY

The present disclosure is to provide an electrostatic discharge (ESD) protection device so as to perform ESD protection.

An aspect of the present invention is to provide an ESD protection device, which comprises a first transistor and a second transistor. The first transistor comprises a first bulk electrode, a first electrode and a second electrode, the first bulk electrode and the first electrode form a first parasitic diode, and the first bulk electrode and the second electrode form a second parasitic diode. The second transistor comprises a second bulk electrode, a third electrode and a fourth electrode, the second bulk electrode and the third electrode form a third parasitic diode, and the second bulk electrode and the fourth electrode form a fourth parasitic diode. The first bulk electrode is connected to the third electrode, and the second bulk electrode is connected to the first electrode.

Another aspect of the present invention is to provide an ESD protection device, which comprises a first transistor and a second transistor. The first transistor comprises a first bulk electrode, a first electrode and a second electrode, and the first transistor comprises a first parasitic diode and a second parasitic diode therein. The second transistor comprises a second bulk electrode, a third electrode and a fourth electrode, and the second transistor comprises a third parasitic diode and a fourth parasitic diode therein. The first parasitic diode, the second parasitic diode, the third parasitic diode, and the fourth parasitic diode are configured to selectively conduct an ESD current flowing between two of the first electrode, the second electrode, the third electrode, and the fourth electrode.

In accordance with the present disclosure, the ESD protection device can be applied to effectively enhance the ESD protection of entire circuit so as to improve the capability of conducting the ESD current.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference to the accompanying drawings as follows.

DESCRIPTION OF THE EMBODIMENTS

In the following description, several specific details are presented to provide a thorough understanding of the embodiments of the present invention. One skilled in the relevant art will recognize, however, that the present invention can be practiced without one or more of the specific details, or in combination with or with other components, etc. In other instances, well-known implementations or operations are not shown or described in detail to avoid obscuring aspects of various embodiments of the present invention.

The terms used in this specification generally have their ordinary meanings in the art and in the specific context where each term is used. The use of examples anywhere in this specification, including examples of any terms discussed herein, is illustrative only, and in no way limits the scope and meaning of the invention or of any exemplified term. Likewise, the present invention is not limited to various embodiments given in this specification.

As used herein, the terms "comprising," "including," "having," "containing," "involving," and the like are to be understood to be open-ended, i.e., to mean including but not limited to.

Reference throughout the specification to "one embodiment" or "an embodiment" means that a particular feature, structure, implementation, or characteristic described in connection with the embodiment is included in at least one embodiment of the present invention. Thus, uses of the phrases "in one embodiment" or "in an embodiment" in various places throughout the specification are not necessarily all referring to the same embodiment. Furthermore, the particular features, structures, implementation, or characteristics may be combined in any suitable manner in one or more embodiments.

Figure 1:
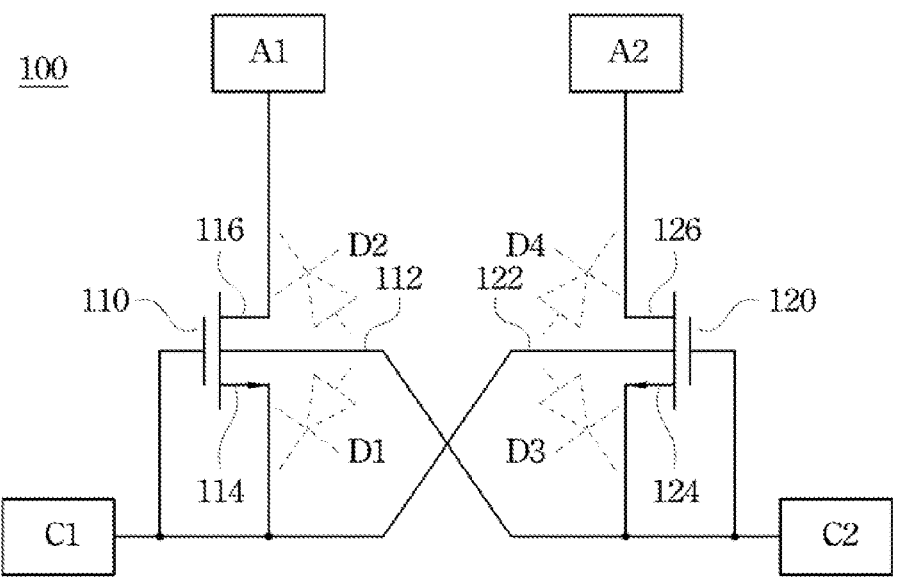
FIG. 1 is a diagram of an electrostatic discharge (ESD) protection device according to one embodiment of the present invention.

FIG. 1 is a diagram of an electrostatic discharge (ESD) protection device according to one embodiment of the present invention. The ESD protection device 100 includes a first transistor 110 and a second transistor 120. The first transistor 110 includes a first bulk electrode 112 and two electrodes 114, 116. The second transistor 120 includes a second bulk electrode 122 and two electrodes 124, 126. The first bulk electrode 112 is connected to the electrode 124, and the second bulk electrode 122 is connected to the electrode 114. In the present embodiment, the first bulk electrode 112 and the two electrodes 114, 116 form parasitic diodes D1, D2, respectively, and the second bulk electrode 122 and the two electrodes 124, 126 form parasitic diodes D3, D4, respectively.

In practice, the first transistor 110 and the second transistor 120 can be respectively implemented by a bipolar junction transistor (BJT) or a metal oxide semiconductor field effect transistor (MOSFET). For example, the first transistor 110 and the second transistor 120 both can be NPN BJT or PNP BJT, and the first bulk electrode 112 and the second bulk electrode 122 can separately be the base electrode of the BJT. Moreover, the first transistor 110 and the second transistor 120 both can be N-type MOSFET or P-type MOSFET. Although FIG. 1 illustrates two N-type MOSFETs, it is not limiting of the present invention. It is well known for persons of ordinary skill in the art to select and use appropriate transistor devices according to practical needs.

In FIG. 1, the first bulk electrode 112 of the first transistor 110 is connected to the electrode 124 of the second transistor 120, the second bulk electrode 122 of the second transistor 120 is connected to the electrode 114, and the parasitic diodes D1, D2, D3, D4 can be formed in the first transistor 110 and the second transistor 120, respectively, so an ESD current flowing between two of the electrodes 114, 116, 124, 126 can be selectively conducted by the parasitic diodes D1, D2, D3, D4, such that the operation of ESD protection can be performed effectively.

In the other embodiment, for the first transistor 110, the first bulk electrode 112 and the electrodes 114, 116 may form an equivalent circuit, and for the second transistor 120, the second bulk electrode 122 and the electrodes 124, 126 may form another equivalent circuit.

For example, the first transistor 110 and the second transistor 120 are respectively implemented by N-type MOSFET or P-type MOSFET, in which the first bulk electrode 112 and the electrodes 114, 116 form a parasitic BJT, and the second bulk electrode 122 and the electrodes 124, 126 form another parasitic BJT. Specifically, when the first transistor 110 and the second transistor 120 are implemented by N-type MOSFET, the first bulk electrode 112 and the electrodes 114, 116 may form a parasitic NPN BJT, and the second bulk electrode 122 and the electrodes 124, 126 may form another parasitic NPN BJT. When the first transistor 110 and the second transistor 120 are implemented by P-type MOSFET, the first bulk electrode 112 and the electrodes 114, 116 may form a parasitic PNP BJT, and the second bulk electrode 122 and the electrodes 124, 126 may form another parasitic PNP BJT.

On the other hand, in the other embodiment, the first bulk electrode 112 is connected to the electrode 124 without any diode device connected between the first bulk electrode 112 and the electrode 124, and the second bulk electrode 122 is connected to the electrode 114 without any diode device connected between the second bulk electrode 122 and the electrode 114, such that any physical diode device or diode circuit can be saved between the first transistor 110 and the second transistor 120.

In another embodiment, the first bulk electrode 112 can be directly connected to the electrode 124, and the second bulk electrode 122 can be directly connected to the electrode 114. The term "directly connected" throughout the specification not only means that there is no physical device between the two electrodes, but also means that there may be any resistor or other devices, which does not substantially affect the operation and layout area of the circuit, existing between the two electrodes.

Therefore, in practice, any physical diode device or circuit can be saved between the first transistor 110 and the second transistor 120, such that when the ESD protection device 100 operates, the parasitic diodes D1, D2, D3, D4 and/or the parasitic BJTs formed therein can be used as the main ESD protection path to selectively conduct the ESD current flowing between two of the electrodes 114, 116, 124, 126 to achieve the object of ESD protection.

The following exemplary embodiments are made to describe the operation of the ESD protection device 100. FIGS. 2-5 are operation diagrams of the ESD protection device 100 shown in FIG. 1 according to one embodiment of the present invention. For purposes of illustration, in FIGS. 2-5, the first transistor 110 and the second transistor 120 both are implemented by N-type MOSFET, and the electrodes 114, 116, 124, 126 are connected to terminals C1, A1, C2, A2, respectively. In addition, although the following description will be made with the example in which the first bulk electrode 112 and the electrodes 114, 116 form a first parasitic NPN BJT, and the second bulk electrode 122 and the electrodes 124, 126 form a second parasitic NPN BJT, it is not limiting of the present invention.

Figure 2:
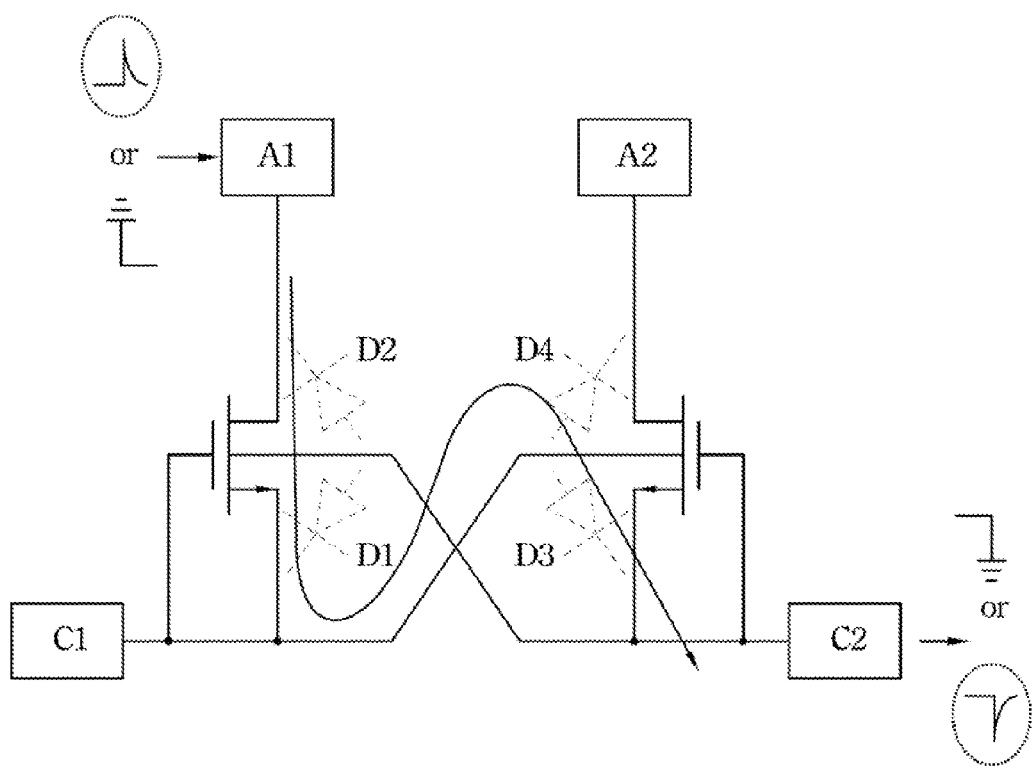
FIGS. 2-5 are operation diagrams of the ESD protection device 100 shown in FIG. 1 according to one embodiment of the present invention.

As shown in FIG. 2, when the terminal A1 is contacted with an object carrying positive charges and the terminal C2 is contacted with a ground potential GND (or the terminal A1 is contacted with the ground potential GND and the terminal C2 is contacted with an object carrying negative charges), the first parasitic NPN BJT (including D2, D1) and the parasitic diode D3 can conduct the ESD current flowing from the terminal A1 toward the terminal C2; that is, the ESD current can flow from the terminal A1 through the first parasitic NPN BJT and the parasitic diode D3 toward the terminal C2, such that the ESD current can be released effectively to achieve the effect of ESD protection.

Figure 3:
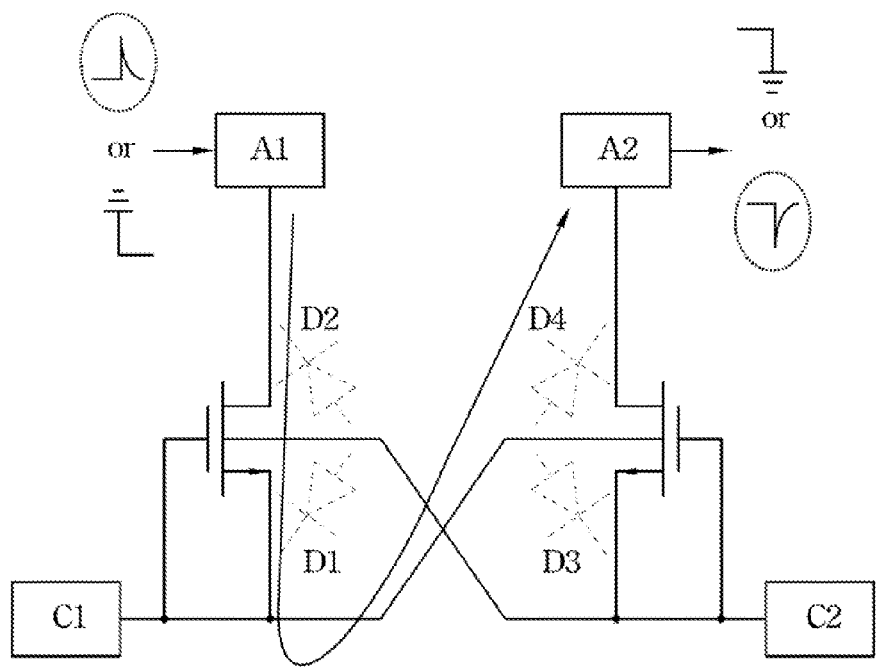

As shown in FIG. 3, when the terminal A1 is contacted with an object carrying positive charges and the terminal A2 is contacted with the ground potential GND (or the terminal A1 is contacted with the ground potential GND and the terminal A2 is contacted with an object carrying negative charges), the first parasitic NPN BJT (including D2, D1) and the parasitic diode D4 can conduct the ESD current flowing from the terminal A1 toward the terminal A2; that is, the ESD current can flow from the terminal A1 through the first parasitic NPN BJT and the parasitic diode D4 toward the terminal A2, such that the ESD current can be released effectively to achieve the effect of ESD protection.

Figure 4:
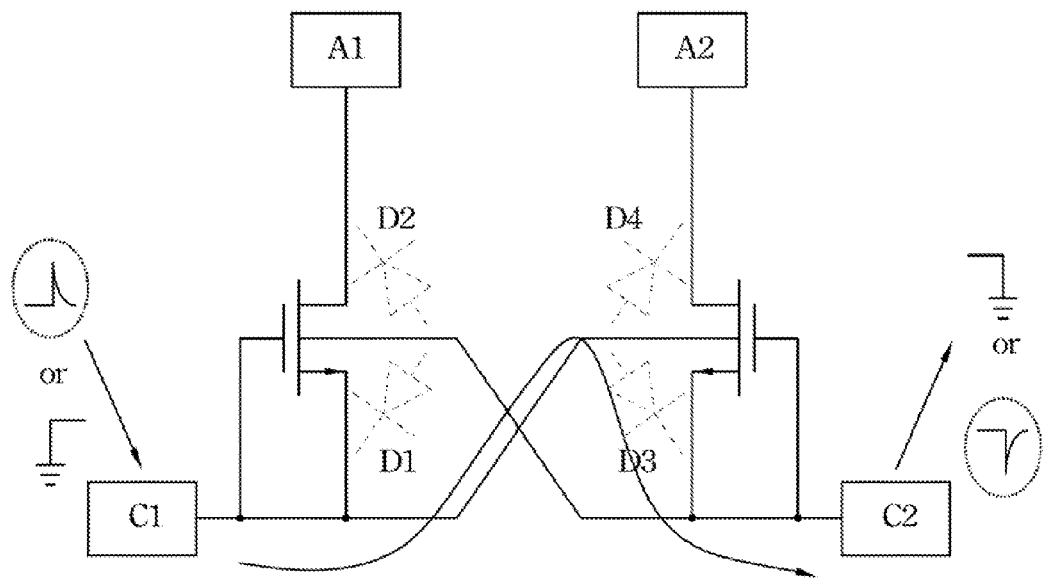

As shown in FIG. 4, when the terminal C1 is contacted with an object carrying positive charges and the terminal C2 is contacted with the ground potential GND (or the terminal C1 is contacted with the ground potential GND and the terminal C2 is contacted with an object carrying negative charges), the parasitic diode D3 can conduct the ESD current flowing from the terminal C1 toward the terminal C2; that is, the ESD current can flow from the terminal C1 through the parasitic diode D3 toward the terminal C2, such that the ESD current can be released effectively to achieve the effect of ESD protection.

Figure 5:
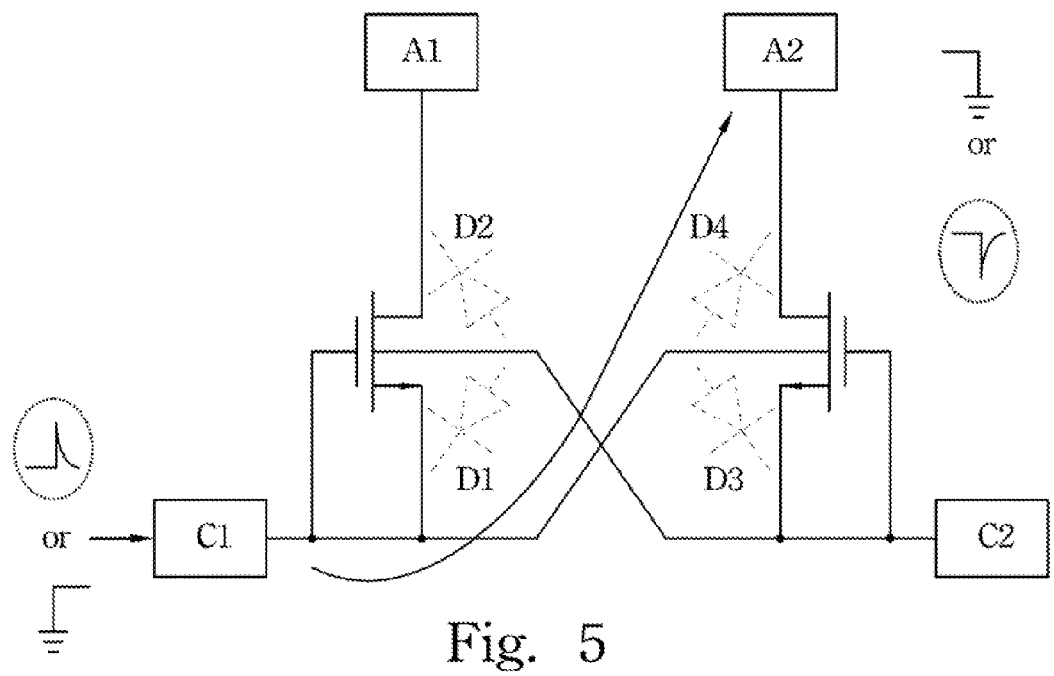

As shown in FIG. 5, when the terminal C1 is contacted with an object carrying positive charges and the terminal A2 is contacted with the ground potential GND (or the terminal C1 is contacted with the ground potential GND and the terminal A2 is contacted with an object carrying negative charges), the parasitic diode D4 can conduct the ESD current flowing from the terminal C1 toward the terminal A2; that is, the ESD current can flow from the terminal C1 through the parasitic diode D4 toward the terminal A2, such that the ESD current can be released effectively to achieve the effect of ESD protection.

Figure 6:
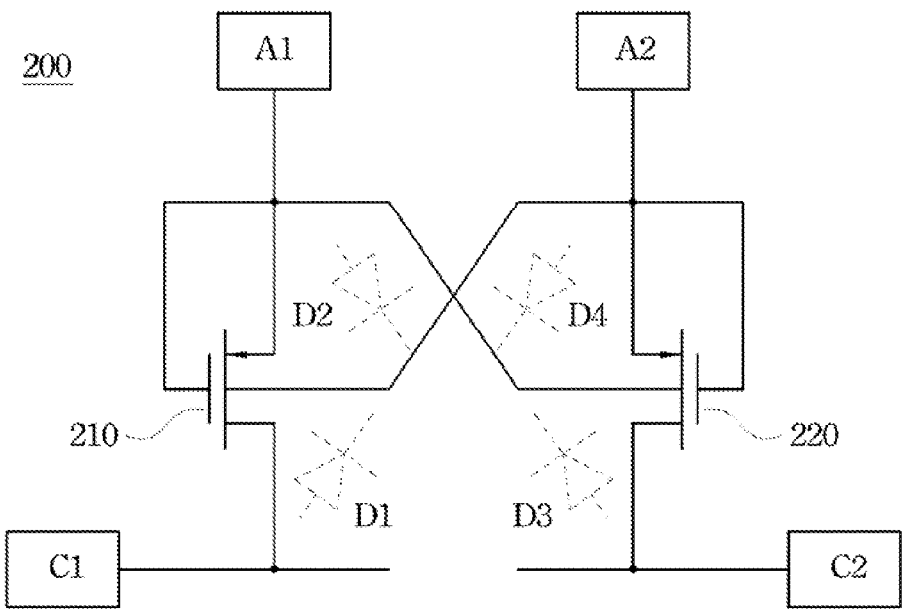
FIG. 6 is a diagram of an electrostatic discharge (ESD) protection device according to another embodiment of the present invention.

FIG. 6 is a diagram of an electrostatic discharge (ESD) protection device according to another embodiment of the present invention. Compared to FIG. 1, the ESD protection device 200 in the present embodiment includes a first transistor 210 and a second transistor 220, and the first transistor 210 and the second transistor 220 both are implemented by P-type MOSFET. In the present embodiment, the devices included in the ESD protection device 200 and their connections are illustrated in FIG. 6 and they are similar to that shown in FIG. 1, so it is not described in more detail for purposes of simplicity. The following description will be made with the example in which the first bulk electrode 112 and the electrodes 114, 116 form a first parasitic PNP BJT, and the second bulk electrode 122 and the electrodes 124, 126 form a second parasitic PNP BJT, and however, it is not limiting of the present invention.

The following exemplary embodiments are made to describe the operation of the ESD protection device 200. FIGS. 7-10 are operation diagrams of the ESD protection device 200 shown in FIG. 6 according to one embodiment of the present invention.

Figure 7:
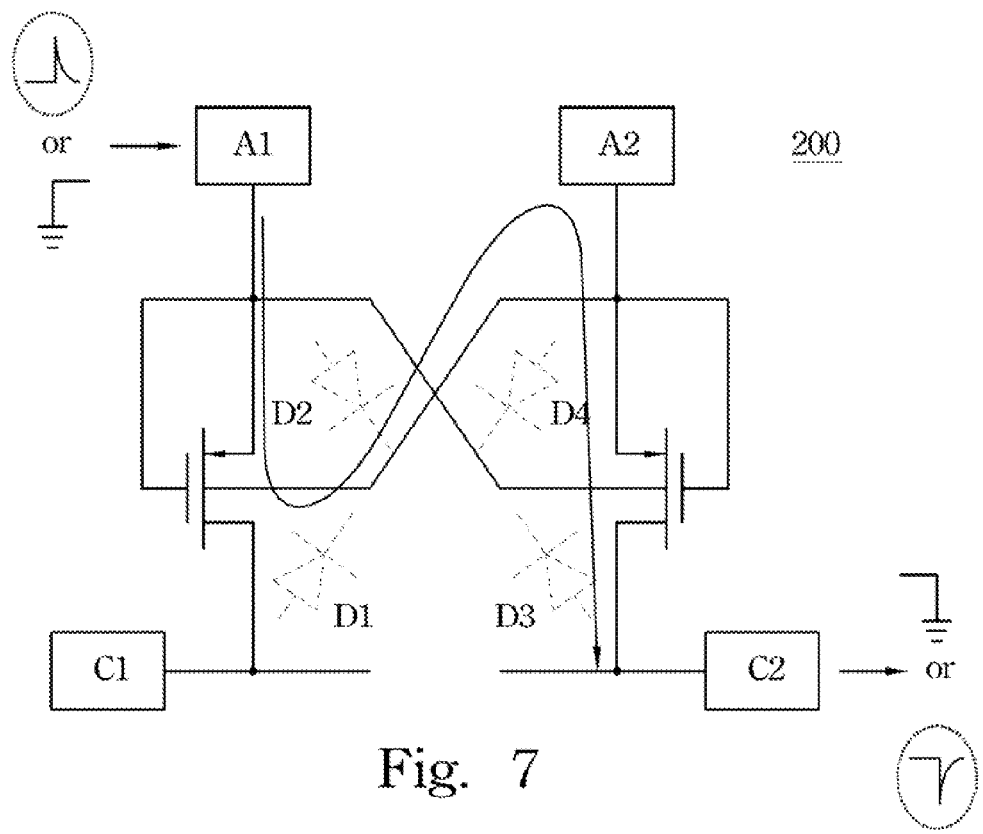
FIGS. 7-10 are operation diagrams of the ESD protection device 200 shown in FIG. 6 according to one embodiment of the present invention.

As shown in FIG. 7, when the terminal A1 is contacted with an object carrying positive charges and the terminal C2 is contacted with the ground potential GND (or the terminal A1 is contacted with the ground potential GND and the terminal C2 is contacted with an object carrying negative charges), the parasitic diode D2 and the second parasitic PNP BJT (including D4, D3) can conduct the ESD current flowing from the terminal A1 toward the terminal C2; that is, the ESD current can flow from the terminal A1 through the parasitic diode D2 and the second parasitic PNP BJT toward the terminal C2, such that the ESD current can be released effectively to achieve the effect of ESD protection.

Figure 8:
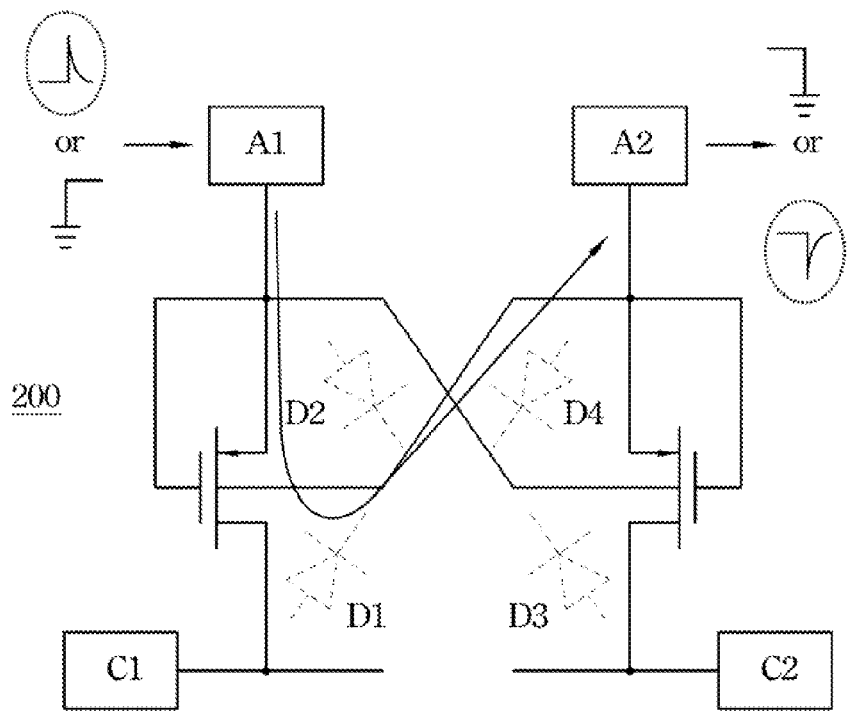

As shown in FIG. 8, when the terminal A1 is contacted with an object carrying positive charges and the terminal A2 is contacted with the ground potential GND (or the terminal A1 is contacted with the ground potential GND and the terminal A2 is contacted with an object carrying negative charges), the parasitic diode D2 can conduct the ESD current flowing from the terminal A1 toward the terminal A2; that is, the ESD current can flow from the terminal A1 through the parasitic diode D2 toward the terminal A2, such that the ESD current can be released effectively to achieve the effect of ESD protection.

Figure 9:
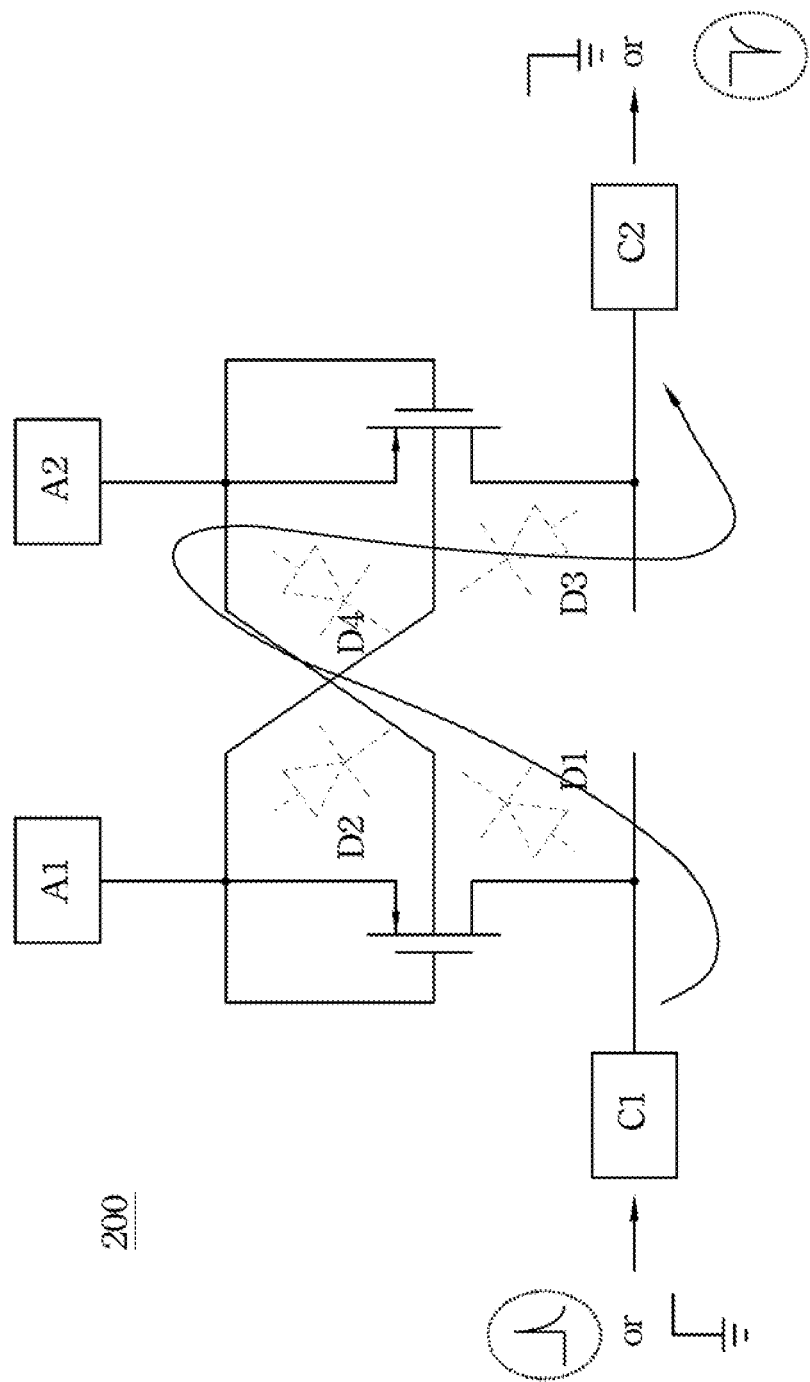

As shown in FIG. 9, when the terminal C1 is contacted with an object carrying positive charges and the terminal C2 is contacted with the ground potential GND (or the terminal C1 is contacted with the ground potential GND and the terminal C2 is contacted with an object carrying negative charges), the parasitic diode D1 and the second parasitic PNP BJT (including D4, D3) can conduct the ESD current flowing from the terminal C1 toward the terminal C2; that is, the ESD current can flow from the terminal C1 through the parasitic diode D1 and the second parasitic PNP BJT toward the terminal C2, such that the ESD current can be released effectively to achieve the effect of ESD protection.

Figure 10:
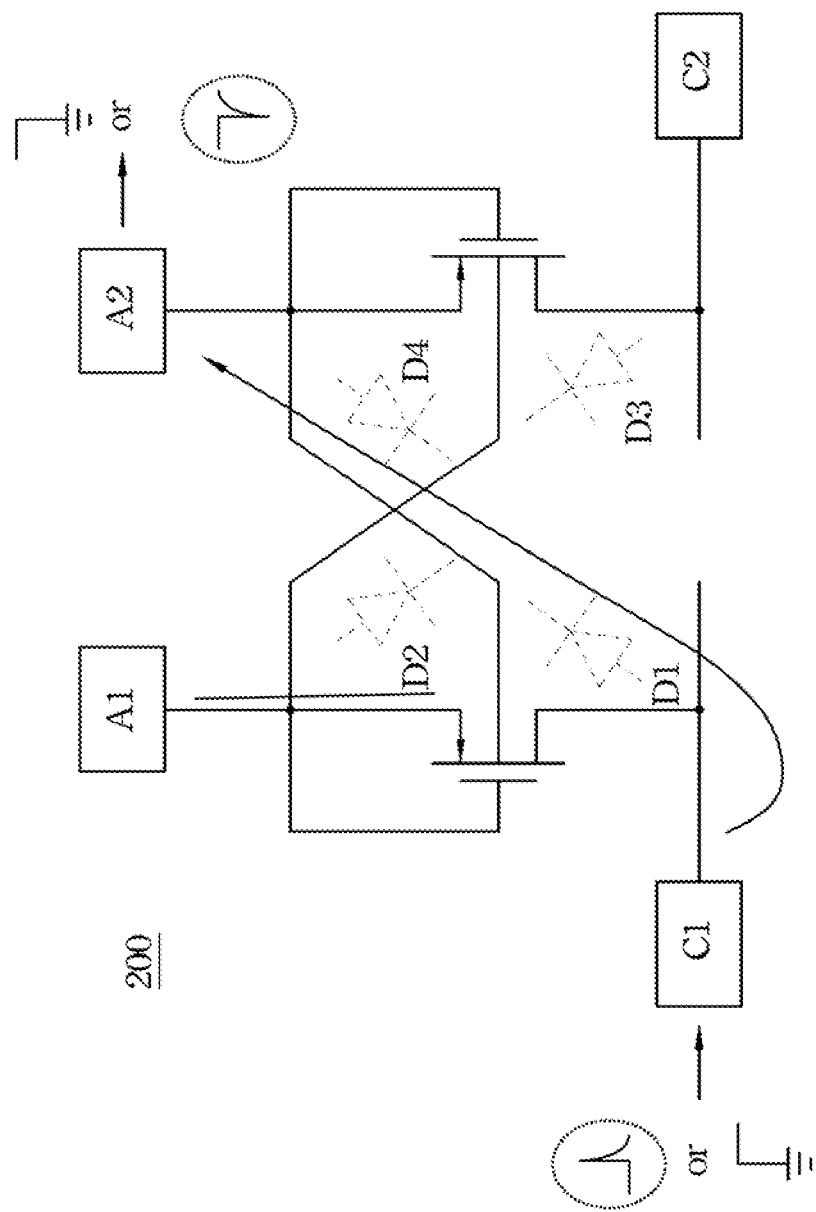

As shown in FIG. 10, when the terminal C1 is contacted with an object carrying positive charges and the terminal A2 is contacted with the ground potential GND (or the terminal C1 is contacted with the ground potential GND and the terminal A2 is contacted with an object carrying negative charges), the parasitic diode D1 can conduct the ESD current flowing from the terminal C1 toward the terminal A2; that is, the ESD current can flow from the terminal C1 through the parasitic diode D1 toward the terminal A2, such that the ESD current can be released effectively to achieve the effect of ESD protection.

In general, in the device disclosed in prior art (referred to as conventional device herein), the first transistor 110 and the second transistor 120 shown in FIG. 1 are usually separated from each other. As a result, the ESD protection cannot be performed effectively to the internal circuits.

Furthermore, in the protection device disclosed in prior art (referred to as conventional protection device herein), even if the first transistor 110 and the second transistor 120 are connected to each other, they are usually connected to each other through the physical diode device in order to achieve the effect of ESD protection. However, this will increase the layout area required for the circuits, leading to increase of area of the device (e.g., chip).

Compared to the skill in the prior art, the ESD protection device in the embodiments of the present invention can be applied to perform the operation of ESD protection effectively, so that the ESD protection can be provided at the interface between different power domains to prevent the internal circuits from being damaged, and can be applied to achieve the effect of noise isolation and to decrease the layout area required for the circuits and the area of the device.

Figure 11:
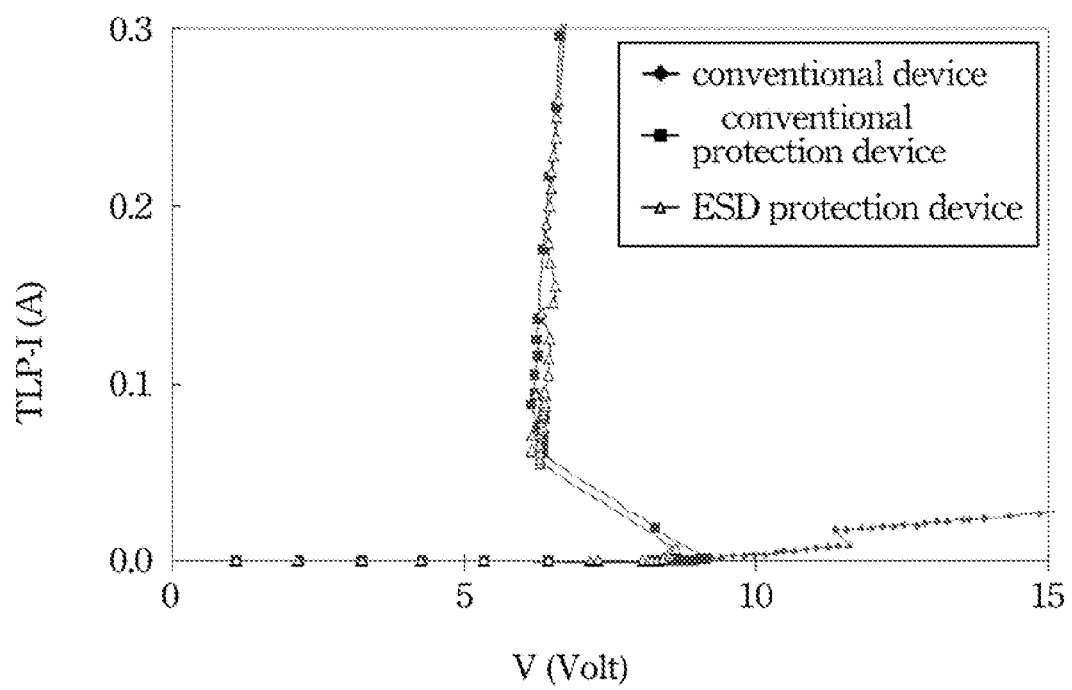
FIG. 11 is a comparison diagram of a conventional device, a conventional protection device and the ESD protection device in the embodiment of the present invention being tested by a transmission line pulse (TLP) generator.

FIG. 11 is a comparison diagram of a conventional device, a conventional protection device and the ESD protection device in the embodiment of the present invention being tested by a transmission line pulse (TLP) generator. As shown in FIG. 11, the ESD protection device in the embodiment of the present invention has better capability of ESD protection than the conventional device, and its capability of ESD protection is approximately the same as that of the conventional protection device. However, the ESD protection device in the embodiment of the present invention requires smaller layout area and device area than the conventional protection device does.

As is understood by a person skilled in the art, the foregoing embodiments of the present invention are illustrative of the present invention rather than limiting of the present invention. It is intended to cover various modifications and similar arrangements included within the spirit and scope of the appended claims, the scope of which should be accorded with the broadest interpretation so as to encompass all such modifications and similar structures.

What is claimed is:

1. An electrostatic discharge (ESD) protection device comprising:
    a first transistor comprising a first bulk electrode, a first electrode and a second electrode, the first bulk electrode and the first electrode forming a first parasitic diode, the first bulk electrode and the second electrode forming a second parasitic diode; and
    a second transistor comprising a second bulk electrode, a third electrode and a fourth electrode, the second bulk electrode and the third electrode forming a third parasitic diode, the second bulk electrode and the fourth electrode forming a fourth parasitic diode, wherein the first transistor and the second transistor both are P-type transistors or N-type transistors;
    wherein the first bulk electrode is connected to the third electrode, and the second bulk electrode is connected to the first electrode.

2. The ESD protection device as claimed in claim 1, wherein the first bulk electrode is directly connected to the third electrode, and the second bulk electrode is directly connected to the first electrode.

3. The ESD protection device as claimed in claim 1, wherein the first bulk electrode is connected to the third electrode without any diode device connected between the first bulk electrode and the third electrode, and the second bulk electrode is connected to the first electrode without any diode device connected between the second bulk electrode and the first electrode.

4. The ESD protection device as claimed in claim 1, wherein the first transistor and the second transistor are respectively implemented by a bipolar junction transistor (BJT) or a metal oxide semiconductor field effect transistor (MOSFET).

5. The ESD protection device as claimed in claim 1, wherein the first transistor and the second transistor are respectively implemented by a metal oxide semiconductor field effect transistor (MOSFET), the first bulk electrode, the first electrode and the second electrode form a first parasitic bipolar junction transistor (BJT), the second bulk electrode, the third electrode and the fourth electrode form a second parasitic bipolar junction transistor (BJT).

6. The ESD protection device as claimed in claim 1, wherein the first transistor and the second transistor both are the N-type transistors, and the first bulk electrode and the second bulk electrode are configured to be connected to a relatively low level terminal.

7. The ESD protection device as claimed in claim 1, wherein the first transistor and the second transistor both are the P-type transistors, and the first bulk electrode and the second bulk electrode are configured to be connected to a relatively high level terminal.

8. An electrostatic discharge (ESD) protection device comprising:
  a first transistor comprising a first bulk electrode, a first electrode and a second electrode, the first transistor comprising a first parasitic diode and a second parasitic diode therein; and
  a second transistor comprising a second bulk electrode, a third electrode and a fourth electrode, the second transistor comprising a third parasitic diode and a fourth parasitic diode therein, wherein the first transistor and the second transistor both are P-type transistors or N-type transistors;
  wherein the first parasitic diode, the second parasitic diode, the third parasitic diode, and the fourth parasitic diode are configured to selectively conduct an ESD current flowing between two of the first electrode, the second electrode, the third electrode, and the fourth electrode;
  wherein the first bulk electrode to the third electrode without any diode device connected the first bulk electrode and the third electrode and the second bulk electrode is connected to the first electrode without any diode connected between the second bulk electrode and the first electrode.

9. The ESD protection device as claimed in claim 8, wherein the ESD current flowing from the first electrode toward the third electrode is conducted by the third parasitic diode.

10. The ESD protection device as claimed in claim 8, wherein the ESD current flowing from the first electrode toward the fourth electrode is conducted by the fourth parasitic diode.

11. The ESD protection device as claimed in claim 8, wherein the first parasitic diode is formed between the first bulk electrode and the first electrode, the second parasitic diode is formed between the first bulk electrode and the second electrode, the third parasitic diode is formed between the second bulk electrode and the third electrode, and the fourth parasitic diode is formed between the second bulk electrode and the fourth electrode.

12. The ESD protection device as claimed in claim 8, wherein the first bulk electrode is directly connected to the third electrode, and the second bulk electrode is directly connected to the first electrode.

13. The ESD protection device as claimed in claim 6, wherein the first transistor and the second transistor are respectively implemented by a bipolar junction transistor (BJT) or a metal oxide semiconductor field effect transistor (MOSFET).

14. The ESD protection device as claimed in claim 8, wherein the first transistor and the second transistor both are the N-type transistors, and the first bulk electrode and the second bulk electrode are configured to be connected to a relatively low level terminal.

15. The ESD protection device as claimed in claim 8, wherein the first transistor and the second transistor both are the P-type transistors, and the first bulk electrode and the second bulk electrode are configured to be connected to a relatively high level terminal.

16. An electrostatic discharge (ESD) protection device comprising:
  a first transistor comprising a first bulk electrode, a first electrode and a second electrode, the first transistor comprising a first parasitic diode and a second parasitic diode therein; and
  a second transistor comprising a second bulk electrode, a third electrode and a fourth electrode, the second transistor comprising a third parasitic diode and a fourth parasitic diode therein, wherein the first transistor and the second transistor both are P-type transistors or N-type transistors;
  wherein the first parasitic diode, the second parasitic diode, the third parasitic diode, and the fourth parasitic diode are configured to selectively conduct an ESD current flowing between two of the first electrode, the second electrode, the third electrode, and the fourth electrode;
  wherein the first transistor and the second transistor both are the N-type transistors, and the first bulk electrode and the second bulk electrode are configured to be connected to a relatively low level terminal.

* * * * *